United States Patent
Kurita (10) Patent No.: US 8,309,436 B2
(45) Date of Patent: Nov. 13, 2012

(54) METHOD OF PRODUCING EPITAXIAL SUBSTRATE WITH GETTERING FOR SOLID-STATE IMAGING DEVICE, AND METHOD OF PRODUCING SOLID-STATE IMAGING DEVICE USING SAME SUBSTRATE

(75) Inventor: Kazunari Kurita, Tokyo (JP)

(73) Assignee: Sumco Corporation, Tokyo (JP)

( * ) Notice: Subject to any disclaimer, the term of this patent is extended or adjusted under 35 U.S.C. 154(b) by 161 days.

(21) Appl. No.: 12/789,649

(22) Filed: May 28, 2010

(65) Prior Publication Data

US 2010/0311199 A1 Dec. 9, 2010

(30) Foreign Application Priority Data

Jun. 5, 2009 (JP) .................................. 2009-136363

(51) Int. Cl.
*H01L 21/322* (2006.01)
(52) U.S. Cl. ........ 438/471; 438/474; 438/475; 438/477; 438/58; 438/143; 438/309; 438/402; 257/913; 257/E21.318
(58) Field of Classification Search .......... 438/471–477, 438/58, 143, 309, 402; 257/E21.318, 913
See application file for complete search history.

(56) References Cited

U.S. PATENT DOCUMENTS

| | | | |
|---|---|---|---|
| 3,508,126 A * | 4/1970 | Beer | 257/184 |
| 5,734,195 A | 3/1998 | Takizawa et al. | |
| 7,745,901 B1 * | 6/2010 | McCaffrey et al. | 257/449 |
| 7,847,253 B2 * | 12/2010 | Carey et al. | 250/338.3 |
| 2008/0096368 A1 | 4/2008 | Sakai | |
| 2009/0261464 A1 * | 10/2009 | Alie | 257/682 |
| 2009/0321883 A1 | 12/2009 | Kurita | |

FOREIGN PATENT DOCUMENTS

| | | |
|---|---|---|
| JP | 6-338507 | 12/1994 |
| JP | 2008-108792 | 5/2008 |

OTHER PUBLICATIONS

Wolf et al. "Silicon Processing for the VLSI Era", vol. 1, pp. 61-70, Lattice Press 1986.*
Korea Office action, dated Jun. 27, 2011 along with an english translation thereof.
M. Sano et al., "Gettering Techniques of Heavy Metal Impurities in Silicon", Sumitomo Sitix Co., Semiconductor Silicon 1994, eds. H. R. Huff et al., Electronchem. Soc., Pennington, 1994, pp. 784-795.

* cited by examiner

*Primary Examiner* — Thanh V Pham (74) *Attorney, Agent, or Firm* — Greenblum & Bernstein, P.L.C.

(57) ABSTRACT

A method of producing an epitaxial substrate for a solid-state imaging device, comprising: forming a gettering sink by injecting laser beam to a semiconductor substrate through one surface thereof, condensing the laser beam to an arbitrarily selected portion of the semiconductor substrate, thereby causing multi-photon absorption process to occur in the portion, and forming a gettering sink having a modified crystal structure; and epitaxially growing at least two epitaxial layers on the semiconductor substrate in which the gettering sink is formed.

8 Claims, 7 Drawing Sheets

//  METHOD OF PRODUCING EPITAXIAL SUBSTRATE WITH GETTERING FOR SOLID-STATE IMAGING DEVICE, AND METHOD OF PRODUCING SOLID-STATE IMAGING DEVICE USING SAME SUBSTRATE

BACKGROUND OF THE INVENTION

1. Field of the Invention

The present invention relates to a method of producing an epitaxial substrate for a solid-state imaging device, and a method of producing a solid-state imaging device, and to a technology that is capable of forming gettering sites in an epitaxial substrate for a solid-state imaging device easily within a short time.

Priority is claimed on Japanese Patent Application No. 2009-136363, filed Jun. 5, 2009, the content of which is incorporated herein by reference.

2. Description of Related Art

Many cellular telephones, digital video cameras or the like are equipped with high-performance solid-state imaging devices utilizing semiconductors. Recently, performance (e.g., numbers of pixels, sensitivity or the like) of these imaging device is remarkably improved. For example, the solid-state imaging devices are produced using epitaxial substrates formed by growing epitaxial layers on a surface of a semiconductor substrate, and forming a circuit of a photo-diode or the like in the epitaxial layers.

Dark leakage current of a photo-diode is a problematic factor which causes deterioration of imaging properties of a solid-state imaging device. It is considered that the dark leakage current is caused by heavy-metal contamination of a substrate (wafer) during the production process of the device. Conventionally, heavy-metal contamination of a substrate has been suppressed by forming gettering sinks for gettering heavy metals in the interior or on the back surface of a semiconductor wafer. Suppression of heavy-metal concentration in a portion of forming a photo-diode has also been performed by forming gettering sinks in a semiconductor wafer and accumulating (trapping) heavy metals by the gettering sinks.

For example, formation of gettering sinks has been performed by forming oxygen precipitated portions (oxide precipitates) within a substrate by heat treatment of the substrate, and utilizing the oxygen precipitated portions as the gettering sinks (e.g., see M. Sano, S. Sumita, T. Shigematsu and N. Fujino, Semiconductor Silicon 1994, eds. H. R. Huff et al., Electronchem. Soc., Pennington, 1994). Alternatively, gettering sinks may be formed on a back-side of a substrate by forming an amorphous film on a back surface of a substrate (e.g., Japanese Unexamined Patent Application, First Publication, No. Hei6-338507).

However, in the method of forming oxygen precipitated portions within a substrate by a heat treatment of the substrate, long time heat treatment is required for forming oxide precipitated portions of sufficient sizes to sufficiently getter the heavy metals, resulting in lengthy production process and a high production cost. In addition, there is a possibility that the heat treatment process itself may cause additional contamination of the substrate with heavy metals originating from a heating apparatus or the like.

On the other hand, in the recent stream, double-side polished large sized substrates such as 300 mm wafers are mainly used in device production. It is difficult to form gettering sinks constituted of amorphous film formed on the back surface of the substrate in the case of using double side polished substrates.

Based on the consideration of the above-described circumstance, an object of the present invention is to provide a method of producing an epitaxial substrate for a solid-state imaging device, wherein gettering sinks can be formed easily within a short time while avoiding heavy-metal contamination during the production process of the gettering sinks.

Another object of the present invention is to provide a method of producing a solid-state imaging device at low cost while suppressing heavy-metal contamination.

SUMMARY OF THE INVENTION

A method of producing an epitaxial substrate for a solid-state imaging device according to the present invention includes: forming a gettering sink by injecting (incidenting, inputting) laser beam to a semiconductor substrate through a surface thereof, condensing the laser beam to an arbitrarily selected (predetermined) portion of the semiconductor substrate, thereby causing a multi-photon absorption process to occur in the portion, and forming a gettering sink having a modified crystal structure; and epitaxially growing at least two epitaxial layers on the semiconductor substrate in which the gettering sink is formed.

Wavelength of the laser beam may be selected from a wavelength range of light capable of transmitting the semiconductor substrate. The laser beam may be condensed to an arbitrarily selected portion in the thickness direction of the semiconductor substrate.

Preferably, the laser beam may be an ultra-short pulse laser beam having a pulse width in a range of $1.0 \times 10^{-15}$ to $1.0 \times 10^{-8}$ second, and a wavelength in a range of 300 to 1200 nm.

Preferably, the ultra-short pulse laser beam may be controlled to have a peak power density of $1.0 \times 10^6$ to $1.0 \times 10^{11}$ second·W/cm$^2$ and a beam diameter of 1 μm to 10 mm in the portion of the semiconductor substrate.

The semiconductor substrate may be made of single crystalline silicon, and the gettering sink may include silicon of amorphous structure.

A method of producing a solid-state imaging device according to the present invention includes forming an embedded (buried) photo-diode in an epitaxial substrate obtained by the above-described method of producing an epitaxial substrate for a solid-state imaging device, and annealing the substrate having the embedded photo-diode formed therein at a predetermined temperature, thereby performing gettering of heavy metals using the gettering sink.

That is, the method of producing a solid-state imaging device according to the present invention may include producing an epitaxial substrate using the above-described method of producing an epitaxial substrate, forming an embedded photo-diode in an epitaxial substrate obtained using the above-described method of producing an epitaxial substrate for a solid-state imaging device, and performing gettering of heavy metals using the gettering sink by annealing the substrate having the embedded photo-diode formed therein at a predetermined temperature.

Preferably the embedded photodiode may be formed in a position overlapping the gettering sink. That is, the embedded photo-diode may be formed such that the gettering sink is positioned beneath the embedded photo-diode in a thickness direction of the substrate.

Preferably, the above-described method of producing a solid-state imaging device may further comprise thinning the substrate after performing the gettering such that at least the gettering sink is removed from the substrate.

According to a method of producing an epitaxial substrate for a solid-state imaging device according to the present invention, by radiating the laser beam to a semiconductor substrate via a condenser, and condensing the incident laser beam to a minute portion arbitrarily selected from interior portion of the semiconductor substrate, it is possible to cause multi-photon absorption process to occur in the minute portion in the semiconductor substrate, thereby modifying a crystal structure of the minute portion such that the portion serves as a gettering sink. By this method, it is possible to form gettering sinks in the semiconductor substrate easily within a short period of time.

As a result, it is possible to avoid the lengthy heat treatment conventionally required for forming the gettering sinks. Therefore, it is possible to simplify the production method of an epitaxial substrate for a solid-state imaging device, thereby decreasing the production cost. In addition, it is possible to form gettering sinks easily even in a double-side polished substrate such as a 300 mm wafer.

The method of producing a solid-state imaging device according to the present invention is excellent in gettering heavy metals during formation of the device. Therefore, it is possible to produce a solid-state imaging device having excellent imaging properties and low dark leakage current.

PREFERRED EMBODIMENT

In the following, a method of producing an epitaxial substrate for a solid-state imaging device and a method of producing a solid-state imaging device are explained with reference to drawings. The below described embodiment is exemplarily explained so as to facilitate a better understanding of the present invention. Without specific prescription, the present invention is not limited to the below-explained embodiment. In the drawings used in the explanation, some main parts are enlarged for convince of explanation. Therefore, the ratio of respective constituents is not limited by the drawings.

Figure 1:
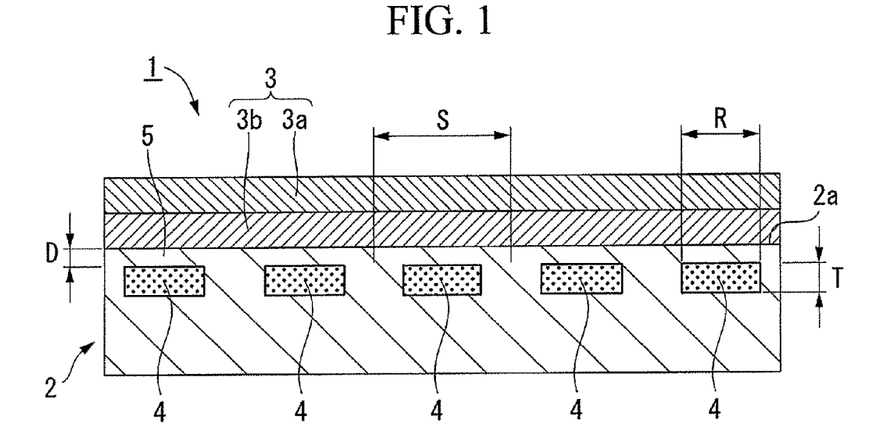
FIG. 1 is a cross-section of an embodiment of an epitaxial substrate for a solid-state imaging device according to the present invention.

FIG. 1 is a magnified cross sectional view showing an embodiment of an epitaxial substrate produced by a method of producing an epitaxial substrate for a solid-state imaging device according to the present invention. The epitaxial substrate 1 (epitaxial substrate for a solid-state imaging device) is a substrate (wafer) that is appropriately used in production of a solid-state imaging device. The epitaxial substrate 1 includes a semiconductor substrate 2, and a plurality of epitaxial layers (sub-layers) 3a, 3b stacked on one surface 2a of the semiconductor substrate 2. Gettering sinks 4 for gettering heavy metals in the epitaxial substrate 1 are formed in portions in a predetermined depth from the surface 2a of the epitaxial substrate 2.

For example, such an epitaxial substrate 1 having an epitaxial layer 3 composed of plural sub-layers, can be appropriately used as a substrate of a back-illuminated type solid-state imaging device. For example, the semiconductor substrate 2 may be a silicon wafer. The epitaxial layer 3 composed of plural sub-layers may be an epitaxial growth film of silicon grown on the one surface 2a (first surface) of the semiconductor substrate 2. For example, the epitaxial layer 3a may be a p-type epitaxial layer doped with boron of $1 \times 10^{18}$ atoms/cm$^3$ to $1 \times 10^{20}$ atoms/cm$^3$, and the epitaxial layer 3b may be a p-type or a n-type epitaxial layer doped with boron or phosphorus in a range of $1 \times 10^{14}$ atoms/cm$^3$ to $1 \times 10^{16}$ atoms/cm$^3$. Where necessary, an additional layer such as a buried oxide film may be formed between the surface 2a of the semiconductor substrate 2 and the epitaxial layer 3a.

The gettering sinks 4 may have an amorphous-like structure in which silicon single crystal is partially modified to amorphous silicon. The gettering sink has ability of trapping (gettering) heavy metals if the crystal structure includes a slight strain. Therefore, it is possible to provide a portion of the substrate with a role of a gettering sink by modifying a crystal structure of the portion to partially include an amorphous structure. The gettering sinks 4 are formed by modifying a crystal structure of a partial portion of the semiconductor substrate 2 by condensing laser beam to the partial portion, thereby generating multi-photon absorption process in the portion. Such a formation method of the gettering sinks 4 is explained in detail in the below described method of forming an epitaxial substrate for a solid-state imaging device.

The gettering sinks 4 are formed in the semiconductor substrate such that a position (planer position) of each element (e.g., photo-diode) of a solid-state imaging device formed using an epitaxial substrate overlaps a position of a gettering sink 4. For example, one of the gettering sinks 4 may have a disk-like shape of 50 to 150 μm in diameter and 10 to 150 μm in thickness. The depth D of the gettering sinks 4 formed in the semiconductor substrate may be 0.5 to 2 μm from a surface 2a of the substrate 2. For example, the upper surface of the above-described gettering sinks 4 may have a depth of 0.5 to 2 μm from a surface 2a of the substrate 2.

Figure 2:
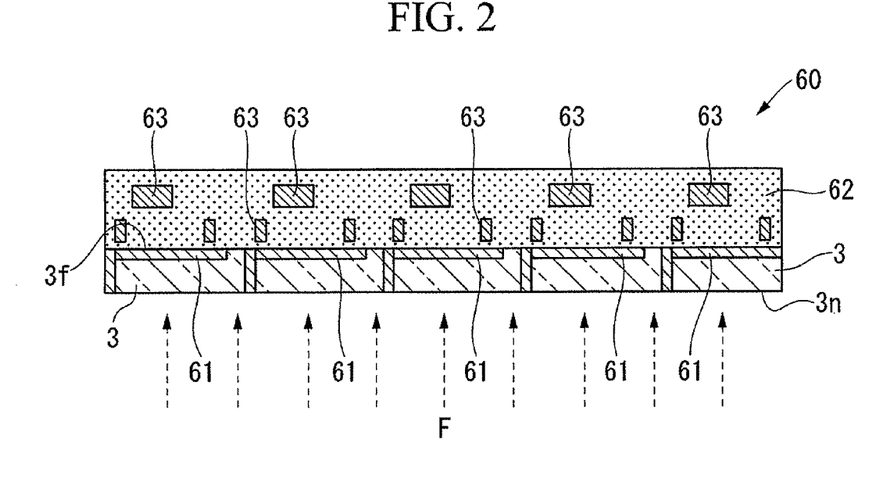
FIG. 2 is a cross-section of an embodiment of a solid-state imaging device.

FIG. 2 is a cross-sectional view of a solid-state imaging device (back illuminated type imaging device) formed using an epitaxial substrate for a solid-state imaging device according to the present invention. The solid-state imaging device 60 comprises photo-diodes 61 formed in the epitaxial layer 3 composed of plural sub-layers, insulation layer 62 formed on a surface (front surface) 3f of the epitaxial layer 3, and an electric wiring 63 formed in the insulation layer 62. During the formation process of the solid-state imaging device 60, a thickness of the epitaxial substrate is reduced by removing the semiconductor substrate by grinding. The incident light F is injected from the other surface (back surface, second surface) 3n of the epitaxial layer 3, and is detected by the photo-diodes 61.

In the solid-state imaging device 60 of the above-described constitution, it is possible to suppress dark leakage currents of photo-diodes 61 which deteriorate imaging properties of a back-illuminated type solid-state imaging device, since the heavy metals included in the epitaxial layer 3 are securely trapped by the gettering sinks 4 formed in the semiconductor substrate 2 of an epitaxial substrate 1 (e.g., see FIG. 1) used in the production of the solid-state imaging device 60. Therefore, it is possible to achieve a solid-state imaging device having an excellent imaging properties.

Next, a method of producing an epitaxial substrate for a solid-state imaging device according to the present invention is explained. FIGS. 3A to 3D are cross-sectional views showing each step of production process of an epitaxial substrate for an imaging device according to the present invention.

Figure 3A:
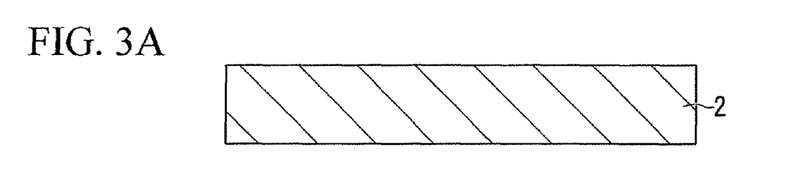
FIGS. 3A to 3D are cross-sectional drawings exemplifying a production process of an epitaxial substrate for a solid-state imaging device according to the present invention.

Firstly, a semiconductor substrate 2 is prepared in the production of a back illuminated type solid-state imaging device (FIG. 3A). For example, the semiconductor substrate 2 may be a single crystalline silicon wafer sliced from an ingot of a silicon single crystal.

Figure 3B:
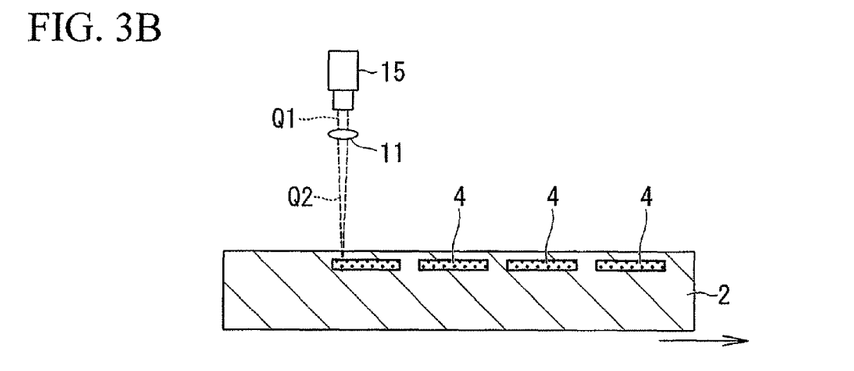

Next, the semiconductor substrate 2 is set in a laser irradiation apparatus 20, and laser beam is irradiated to the semiconductor substrate 2 while moving the semiconductor substrate 2 (FIG. 3B). At that time, laser beam output (emitted) from the laser generation device 15 is condensed by a condenser lens (condensing device) 11 such that the focal point (condensed point) is positioned at a depth of about several tens of μm (1 μm to 100 μm) from a surface 2a of a semiconductor substrate 2. As a result, crystal structure of the semiconductor substrate 2 is modified and the gettering sink 4 is formed (gettering sink formation step).

Figure 6:
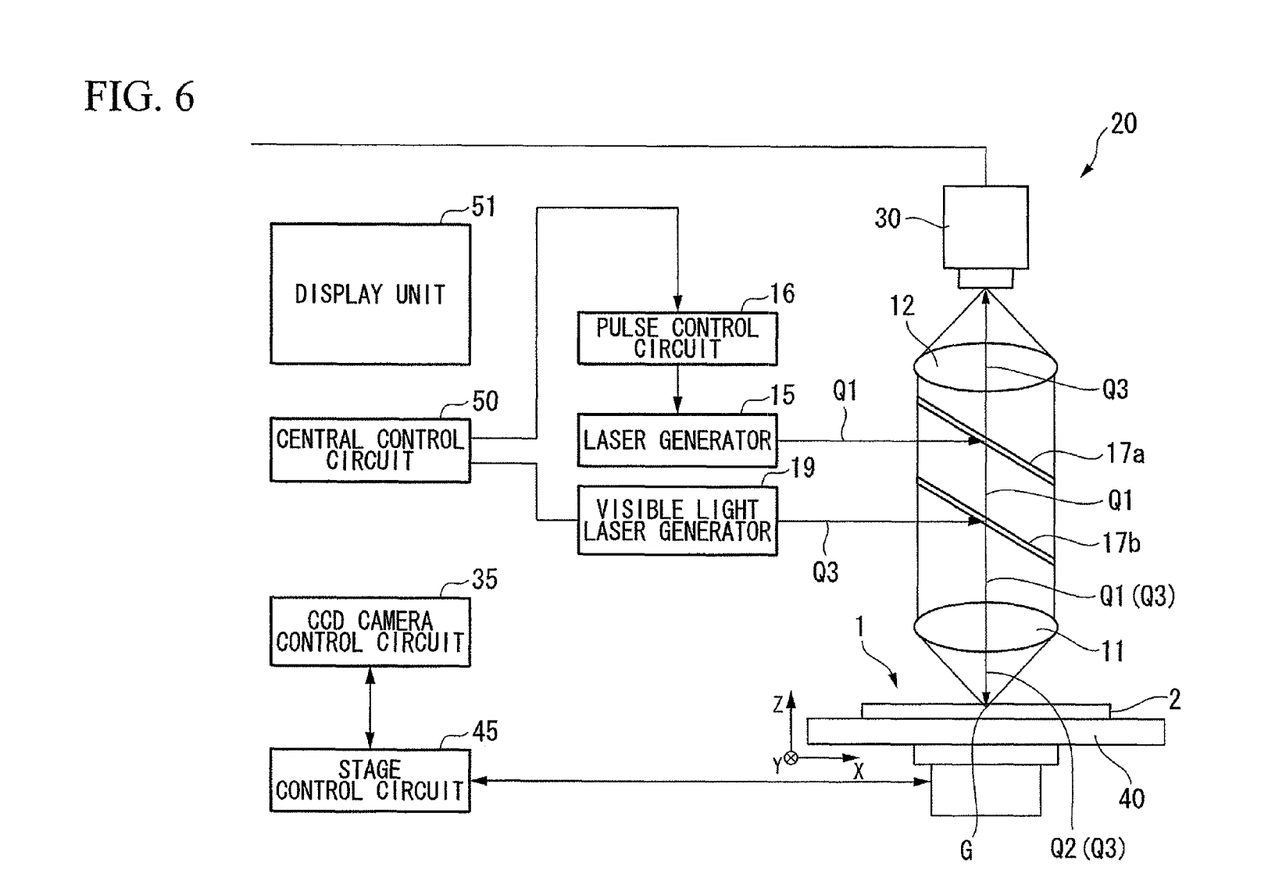
FIG. 6 is a schematic diagram showing an example of a laser radiation apparatus used in production of gettering sinks.

FIG. 6 is a schematic diagram showing an example of a laser irradiation apparatus used in formation of gettering sinks in a semiconductor substrate. The laser irradiation apparatus 20 includes a laser generation device 15 that oscillates the pulse of a laser beam Q1, a pulse controlling circuit (Q switch) 16 that controls pulse of the laser beam Q1 or the like, a beam splitter (half-mirror) 17a that reflects the laser beam Q1 and changes the beam direction by 90° towards the semiconductor substrate 2, a condenser lens (condensing device) 11 that condenses the laser beam Q1 reflected by the beam splitter 17a.

Further the laser irradiation apparatus includes a stage 40 on which the semiconductor substrate 2 is placed. Vertical (Z) and horizontal (X-Y) movement of the stage 40 are possible by a stage controlling circuit 45 so as to condense the condensed laser beam Q2 to a focal point at an arbitrarily selected position.

The constitutions of the laser generation device 15 and the pulse controlling device 16 are not limited to specific constitutions, provided that the laser beam can be irradiated to form gettering sink in an arbitrary position of an interior of the semiconductor substrate by modification of a crystal structure in the position. It is preferable to use a titanium-sapphire laser that can oscillate a laser beam having a wavelength capable of transmitting the semiconductor substrate with a short pulse period. Table 1 shows specific examples of preferable laser irradiation in a general semiconductor substrate and a silicon wafer.

TABLE 1

| | Laser irradiation conditions | |
|---|---|---|
| Wafer species | Semiconductor wafer | Silicon wafer |
| Beam wavelength | 300 to 1200 nm | 1000 to 1200 nm |
| Beam diameter | 0.1 to 100 μm | 0.5 to 1.0 μm |
| Pulse repetition frequency | 0.001 to 100 MHz | 10 to 100 MHz |
| Pulse width | $1.0 \times 10^{-15}$ to $1.0 \times 10^{-8}$ seconds | $1.0 \times 10^{-15}$ to $1.0 \times 10^{-9}$ seconds |
| Output power | 1 to 1000 mJ/pulse | 1 to 100 mJ/pulse |

Optical path width of the laser beam Q1 generated in the laser generation device 15 is condensed by the condenser lens 11. A position of the stage along the vertical direction Z is controlled such that the convergent laser beam Q2 is condensed to a focal point in an arbitrarily selected depth position G in the semiconductor substrate 20. For example, the condenser lens 11 may have a magnification of 10 to 300, a N.A. of 0.3 to 0.9, and a transmittance of 30 to 60% with regard to the laser beam of a specific wave length.

The laser irradiation apparatus 20 further includes a visible-light laser generation device 19, a beam splitter (half-mirror) 17b, a CCD camera 30, a CCD camera controlling circuit 35, an image formation lens 12, a central controlling circuit 50, and a display unit 51.

A laser beam Q3 generated in the visible-light laser generation device 19 is reflected by the beam splitter (half-mirror) 17b, changes its direction by 90°, and is radiated to a surface (one surface) of the semiconductor substrate 2. Then, the laser beam Q3 is reflected by the surface of the semiconductor substrate 2, transmits the condenser lens 11, beam splitters 17a and 17b, and reaches the image formation lens. An image of the visible light laser Q3 which reached the image formation lens 12 is taken by the CCD camera 30 as a surface image of the semiconductor substrate 2, and the image data is inputted to the CCD camera controlling circuit 35. Based on the thus inputted image data, movement of the stage in the horizontal direction X(Y) is controlled by the stage controlling circuit 45.

Figure 7:
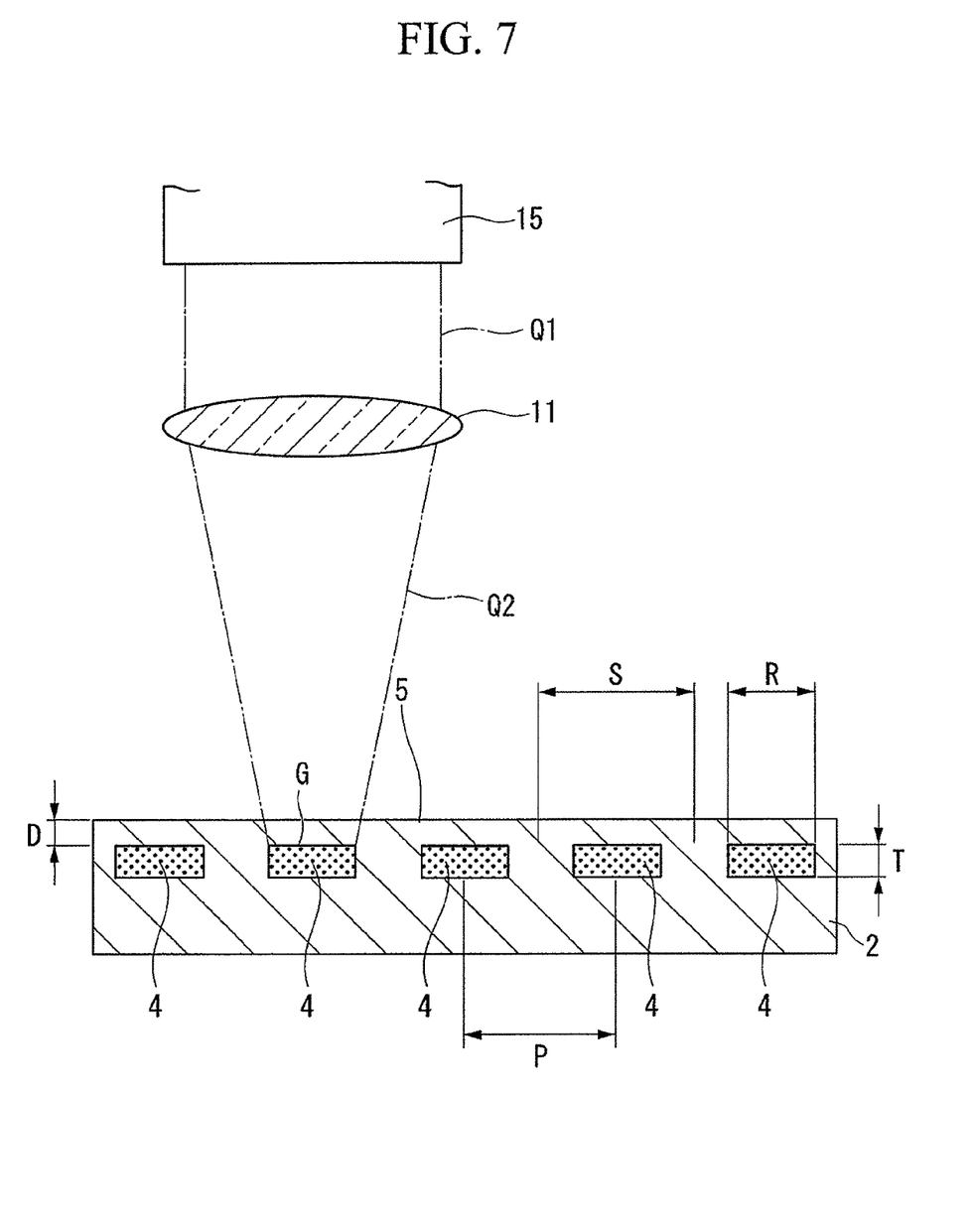
FIG. 7 is a cross sectional drawing showing a formation of gettering sinks in a semiconductor substrate.

Next, a method of forming gettering sinks in the semiconductor substrate 2 is explained in detail. FIG. 7 is a schematic diagram showing a formation process of gettering sinks in a semiconductor substrate using a laser beam. In the production of gettering sinks in the semiconductor substrate 2, the laser beam Q1 injected from the laser generation device 15 is converged by a condenser lens (condensing device) 11. The convergent laser beam Q2 has a wavelength capable of transmitting silicon. Therefore, after reaching the surface of the semiconductor substrate 2, the laser beam Q2 is injected into the semiconductor substrate 2 without being reflected by the surface.

On the other hand, the semiconductor substrate 2 is positioned such that a condensed point (focal point) of the laser beam Q2 is positioned at a predetermined depth D from a surface 2a of the semiconductor substrate 2. As a result, multi-photon absorption process occurs only in the focal point of the laser beam Q2 in the semiconductor substrate.

By irradiation of large amount of photons to a specific portion (irradiated region) within a short time, absorption of a large amount of energy selectively occurs only in the irradiated region. Such a phenomenon is called a multi-photon absorption process, and causes reactions such as modification of chemical bond in a crystal structure of the irradiated region. In the present invention, by condensing the laser beam to an arbitrarily selected portion in the interior of the semiconductor substrate 2, single crystal structure of the semiconductor substrate is modified in the focal point, and amorphous like structure is generated in the partial portion. Such a modification of the crystal structure may be limited to a level capable of providing an ability of trapping heavy metals by slight strain in the crystal structure.

As described above, by setting the focal point of the convergent laser beam Q2 (that is, converged laser beam Q1) in a minute portion arbitrarily selected from the interior of the semiconductor substrate 2, thereby modifying the crystal structure of the minute portion, it is possible to form a gettering sink 4 in the arbitrary minute portion in the semiconductor substrate 2.

With respect to the laser beam for forming the gettering sink, it is important to control the irradiation conditions such that laser beam securely transmits the epitaxial layer 3 and the semiconductor substrate 2 without modifying there crystal structures in the optical path before reaching the condensed point (focal point). Such irradiation conditions of the laser beam are determined depending on an energy band gap which is a basic physical property value of a semiconductor material. For example, since an energy band gap of silicon semiconductor is 1.1 eV, the laser beam has a remarkable transmittance where the wavelength of the incident beam is 1000 nm or more. Thus, wavelength of the laser beam can be determined based on the consideration of the band gap of the semiconductor material.

If a high power output laser such as YAG laser is used, there is a possibility that a generation of heat energy is not limited to a predetermined depth position and the heat is transmitted to the vicinity region. Therefore, it is preferable to use a low power output laser as the laser beam generation device. For example, as the low power output laser, it is preferable to use ultra short pulse laser such as a femto-second laser.

For example, the ultra-short pulse laser of arbitrarily wavelength may be achieved by pumping (exciting) titanium-sapphire crystal (solid-state laser crystal) utilizing a semiconductor laser. In the ultra-short pulse laser, it is possible to control the pulse width of the pumped laser beam to be $1.0 \times 10^{-15}$ seconds or less. Therefore, compared to other lasers, it is possible to suppress diffusion of heat energy generated by pumping, and to concentrate the optical energy at the focal point of the laser beam.

The gettering sinks formed by modifying the crystal structure by multi-photon absorption process are assumed to have an amorphous-like structure. In order to obtain such an amorphous-like structure, it is necessary to perform rapid-heating of the focal point using the laser beam and rapid cooling of the focal point. Although the ultra-short pulse laser having the characteristics as shown in FIG. 1 has little energy, it is possible to provide sufficient energy for rapid heating of a localized portion of a semiconductor device 20 by condensing the laser beam using the condenser lens.

The temperature of the focal point G of the laser beam reaches a high temperature of 9900 to 10000 K. In addition, the energy is inputted to a portion of a very small volume by condensation of the laser beam. Therefore, when the focal point is moved from the portion by a movement of the semiconductor wafer 2 placed on the stage or by scanning of the laser beam, the amount of energy-input in the portion rapidly decreases, and a rapid-cooling effect can be obtained.

By controlling the wavelength of the laser beam to 1000 nm or more as in the ultra-short pulse laser shown in FIG. 1, it is possible to enhance transmittance of the laser beam in the epitaxial layer 3 and the semiconductor substrate 2. Therefore, it is possible to modify the crystal structure only in a minute portion at the focal point of the laser beam while avoiding influencing a crystal structure of other portions such as epitaxial layer 3.

The portion of modified crystal structure can be appropriately utilized as a gettering sink 4 of the semiconductor substrate 2. When the wavelength of the laser beam exceeds 1200 nm, photon energy (laser beam energy) is decreased because of the long wavelength. In such a case, there is a possibility that sufficient energy for modifying the interior portion of the semiconductor substrate 2 cannot be obtained by condensing the laser beam. Therefore, the wavelength of the laser beam is preferably controlled to be 1200 nm or less.

The position (vertical position) of the focal point G of the laser beam, that is, the position of the gettering sink 4 formed in the semiconductor substrate 4 can be controlled by vertical (up-down) movement of the stage. Alternatively, the position of the focal point of the laser beam can be controlled by controlling the position of the condensing device (condenser lens).

For example, in a case of forming a structure-modified portion (gettering sink) in a position at a depth of 2 μm from the surface of a semiconductor substrate, it is possible to modify the crystal structure of the portion by controlling the wavelength of the laser beam to be, for example, 1080 nm, and condensing the laser beam at the position at a depth of 2 μm from the surface of the semiconductor substrate using a condenser lens (50 fold magnification) having a transmittance of 60%.

For example, the gettering sink thus formed by modifying the crystal structure of a minute portion of the semiconductor substrate 2 may have a disk-like shape of 50 to 150 μm in diameter and 10 to 150 μm in thickness. The gettering sink is preferably formed at a depth of 0.5 to 2 μm from a surface 2a of the semiconductor substrate 2. That is, the surface of the gettering sink is preferably positioned at a position of 0.5 to 2 μm depth from a surface 2a of the semiconductor substrate 2.

Each of the gettering sinks 4 is formed such that at least a gettering sink exist beneath a region S in which an element of the solid-state imaging device is formed in the subsequent process. For example, the gettering sinks 4 may be formed with a pitch P of 0.1 to 10 μm in interval.

As an alternative to the above-described gettering sinks 4 formed with interval, for example, the gettering sink 4 may be formed in the entire area of the semiconductor substrate.

Figure 8:
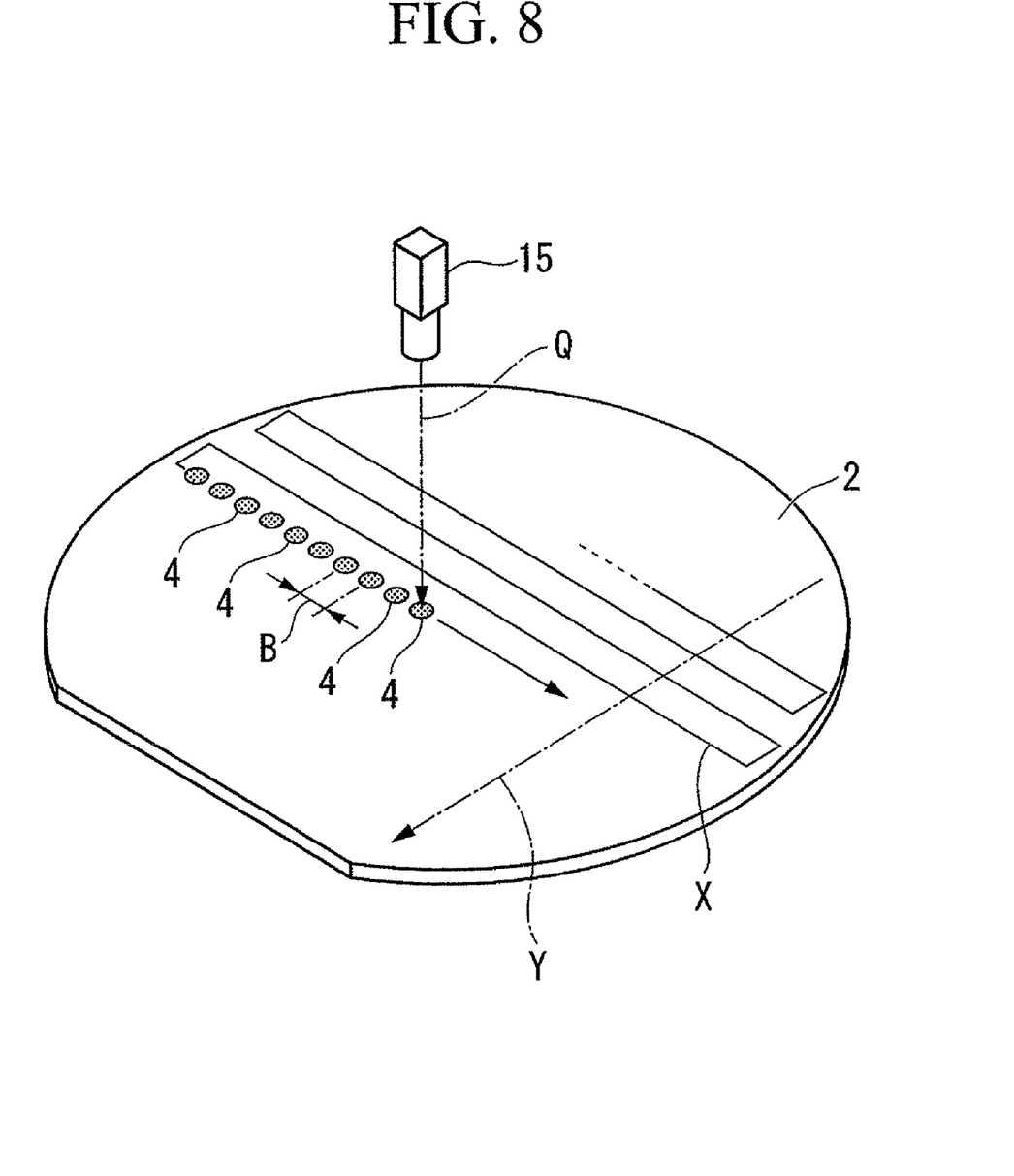
FIG. 8 is a schematic drawing showing a formation of gettering sinks in a semiconductor substrate.

FIG. 8 shows a process of forming gettering sinks in an epitaxial substrate. Each of the gettering sinks is formed beneath a region in which an element of the solid-state imaging device is formed. For example, by irradiating the laser beam Q of predetermined conditions while scanning the laser beam Q along an X direction (a horizontal direction) while sliding the semiconductor substrate in the Y direction (another horizontal direction, e.g., a direction orthogonal to the X-direction), it is possible to form gettering sinks 4 in the entire area of the semiconductor substrate 2.

A density of the gettering sinks 4 formed in the semiconductor substrate 2 may be controlled by controlling the pitch (interval) B of the laser beam Q. For example, an appropriate density of the gettering sink may be controlled in the range of $10 \times 10^5$ to $10 \times 10^7/cm^2$. The density of the gettering sinks 4 may be examined by numbers of oxygen precipitates counted by observation of a section of the semiconductor substrate using a transmission electron microscope (TEM).

In the above-explained embodiment, the gettering sinks 4 are formed using a laser beam of a single optical axis while moving the semiconductor substrate 2 (e.g., single crystal wafer). Alternatively, the gettering sinks 4 may be formed by simultaneously irradiating the laser beams of a plurality of optical axis to the semiconductor substrate 2. Such an embodiment may be performed, for example, by one time irradiation using a laser beam generator having a plurality of laser diodes arranged in a phased array.

By the above-explained process, the gettering sinks 4 are formed in the semiconductor substrate 2. Next, a first epitaxial layer 3a is formed on a surface 2a of the semiconductor substrate 2 having the thus formed gettering sinks 4 (FIG. 3C: Epitaxial Growth Process).

Figure 3C:
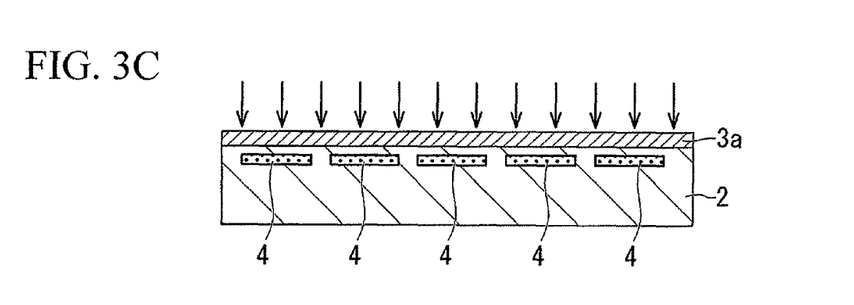

Formation of the first epitaxial layer (sub-layer) 3a may be performed using an epitaxial growth apparatus. For example, by introducing a raw material gas while heating the semiconductor substrate 2 at a predetermined temperature, a first epitaxial layer 3a composed of a single crystalline silicon may be grown on a surface 2a of the semiconductor substrate 2. Where necessary, a buried oxide film (BOX layer) may be formed in the interior of the semiconductor substrate 2.

Figure 3D:
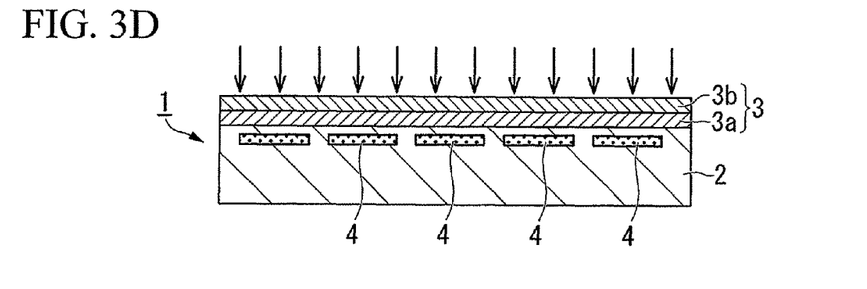

Further, a second epitaxial layer (sub-layer) 3b is laminated on the first epitaxial layer 3a (see FIG. 3D: Epitaxial Growth Process). For example, using an epitaxial growth apparatus, a second epitaxial layer 3b composed of a single crystalline silicon may be grown on the surface of the first epitaxial layer 3a by introducing a raw material gas while heating the semiconductor substrate 2 at a predetermined temperature.

By the above-described processes, it is possible to obtain an epitaxial substrate 1 for a solid-state imaging device, having a semiconductor substrate including gettering sinks 4 formed therein and an epitaxial layer 3 composed of plural sub-layers formed on the substrate.

Next, a method of producing a solid-state imaging device using the above-described epitaxial substrate is explained. FIGS. 4A to 4C, FIG. 5A, and FIG. 5B schematically show a formation process of a back-illuminated type solid-state imaging device, as an example of a solid-state imaging device.

Figure 4A:
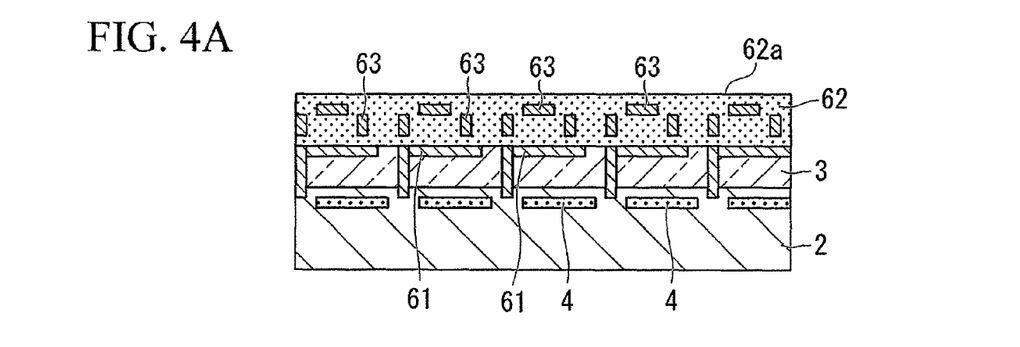
FIGS. 4A to 4C are cross-sectional drawings exemplifying a production process of a solid-state imaging device according to the present invention.
Figure 4B:
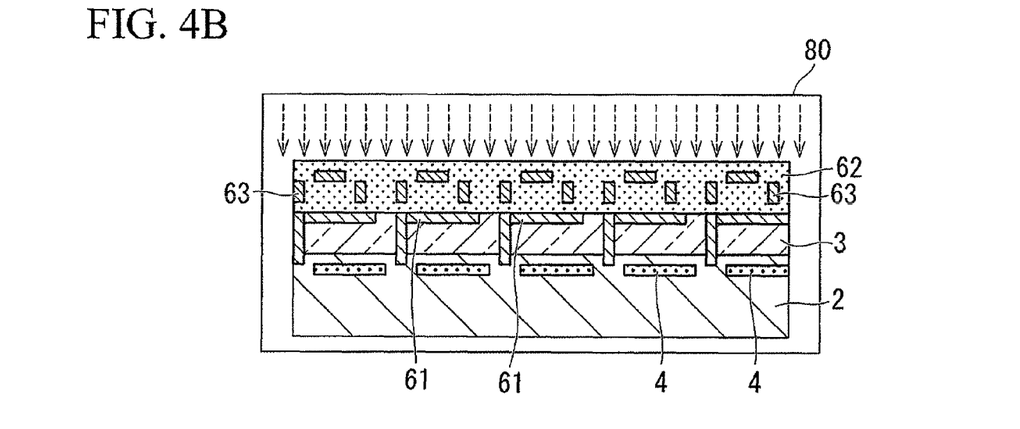

First, using the above-described epitaxial substrate 1 (an epitaxial substrate for a solid-state imaging device), a plurality of photo-diodes 61 are formed in the epitaxial layer 3 composed of plural sub-layers (Device Formation Process). In addition, an insulation layer 62 and wirings 63 are formed on a surface of the epitaxial layer 3 (FIG. 4A). The surface of the insulation layer 62 is flattened. Next, the epitaxial substrate 1 having the thus formed photo-diodes 61 and wirings 63 is heated to a predetermined temperature in an annealing apparatus 80 (FIG. 4B). By this treatment, heavy metals dispersed in the semiconductor substrate 2 are accumulated by the gettering sinks. Thus, it is possible to control the device forming region (the region in which the photo-diodes 61 are formed) to have very small heavy metal concentration (Gettering Process)

Figure 4C:
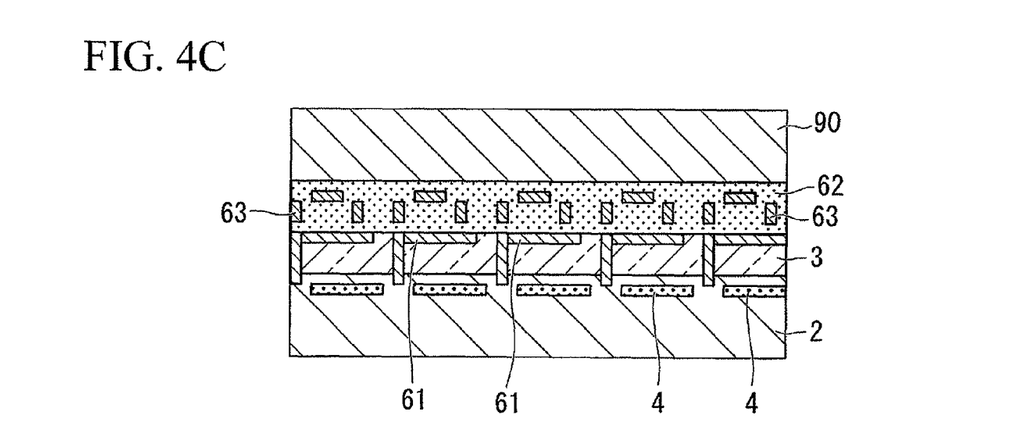

Next, a support substrate 90 is bonded to a surface 62a of the insulation layer 62 (FIG. 4C). The support substrate 90 is bonded so as to prevent deformation of the epitaxial substrate 1 during thinning of the substrate in the subsequent process.

Figure 5A:
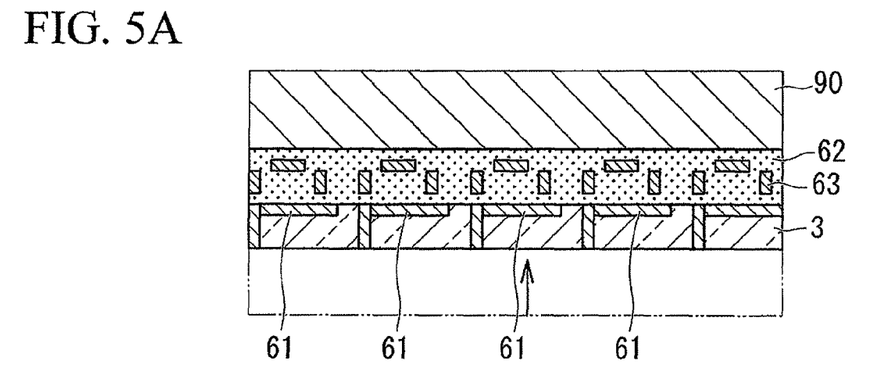
FIGS. 5A to 5B are cross-sectional drawings exemplifying a production process of a solid-state imaging device according to the present invention.

Next, the epitaxial substrate 1 bonded with the support substrate 90 is ground from the other surface (back surface) 2a of the semiconductor substrate 2 (FIG. 5A). By the thus grinding, the epitaxial substrate 1 may be thinned, for example, by removing (grinding) the whole of the semiconductor substrate 2 and a partial portion of the epitaxial layer 3 (Thinning Process).

After the thinning is completed, the support substrate 90 may be delaminated from the insulation layer.

Figure 5B:
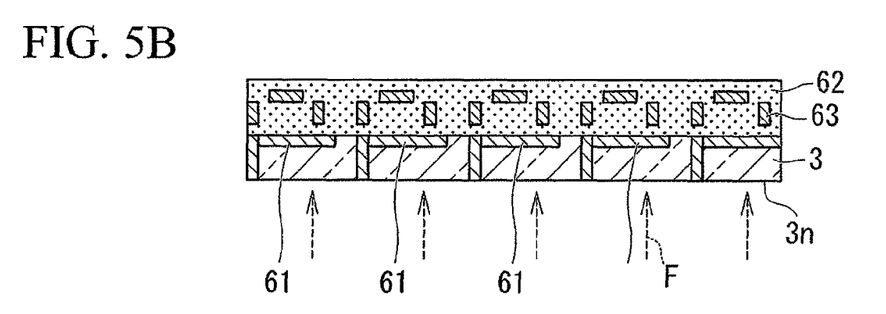

By the above-explained processes, a back-illuminated type solid-state imaging device is formed (FIG. 5B). In such a back-illuminated type solid-state imaging device 60, incident light F is injected from a back surface (second surface) of the epitaxial layer 3 and is detected by the photo-diodes.

As explained above, according to the method of producing a solid-state imaging device of the present invention, by using the epitaxial substrate 1 for a solid-state imaging device, having a semiconductor substrate including gettering sinks 4 formed therein and an epitaxial layer 3 composed of plural sub-layers formed on the substrate, it is possible to avoid lengthy (long time) heat treatment required in the conventional formation process of gettering sinks. Thus, it is possible to simplify the production process of the solid-state imaging device, and reduce the production cost.

Since the heavy metals included in the epitaxial layer are securely trapped by the gettering sinks formed in the semiconductor substrate of the epitaxial substrate, it is possible to suppress the deterioration of the solid-state imaging device caused by the dark-leakage current of a photo-diode. Thus, it is possible to achieve a solid-state imaging device having excellent imaging properties.

In the above-explained embodiment, the gettering process is performed after the formation of photo-diodes 61. Alternatively, it is possible to perform preliminary annealing of an epitaxial substrate to accumulate the heavy metals in the gettering sinks 4 before forming the photo-diodes 61, and use the epitaxial substrate after the gettering process in the production of a solid-state imaging device.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A method of producing an epitaxial substrate for a solid-state imaging device, comprising:

forming a gettering sink by injecting a laser beam to a semiconductor substrate through one surface thereof, condensing the laser beam to an arbitrarily selected portion of the semiconductor substrate, thereby causing a multi-photon absorption process to occur in the portion, and forming a gettering sink having a modified crystal structure; and epitaxially growing at least two epitaxial layers on the semiconductor substrate in which the gettering sink is formed, wherein the laser beam is an ultra-short pulse laser beam having a pulse width in a range of $1.0 \times 10^{-15}$ to $1.0 \times 10^{-8}$ seconds and a wavelength in a range of 300 to 1200 nm, the semiconductor substrate is made of a single crystalline silicon, and the gettering sink includes silicon of an amorphous structure, and wherein the ultra-short pulse laser beam is controlled to have a peak power density of $1.0 \times 10^6$ to $1.0 \times 10^{11}$ second·W/cm$^2$ and a beam diameter of 1 μm to 10 mm in the portion of the semiconductor substrate.

2. The method of producing the epitaxial substrate for the solid-state imaging device according to claim 1, wherein the laser beam has a wavelength capable of transmitting the semiconductor substrate, and the laser beam is condensed to the arbitrarily selected portion in a thickness direction of the semiconductor substrate.

3. A method of producing a solid-state imaging device, comprising:

performing device production of forming an embedded photo-diode in an epitaxial substrate obtained by the method of producing the epitaxial substrate for the solid-state imaging device according to claim 1, and performing gettering of heavy metals by the gettering sink by annealing the substrate having the embedded photo-diode formed therein at a predetermined temperature.

4. The method of producing the solid-state imaging device according to claim 3, wherein the embedded photodiode is formed in a position overlapping the gettering sink.

5. The method of producing the solid-state imaging device according to claim 3, further comprising thinning the substrate after performing the gettering such that at least the gettering sink is removed from the substrate.

6. The method of producing the epitaxial substrate for the solid-state imaging device according to claim 1, wherein the at least two epitaxial layers are grown on the one surface through which the laser beam is injected into the semiconductor substrate.

7. The method of producing the epitaxial substrate for the solid-state imaging device according to claim 1, wherein the gettering sink has a thickness of 10 to 150 μm.

8. The method of producing the epitaxial substrate for the solid-state imaging device according to claim 1, wherein the laser beam is achieved by pumping titanium-sapphire crystal utilizing a semiconductor laser.

* * * * *